United States Patent [19]

Pennell et al.

[11] Patent Number: 5,387,316
[45] Date of Patent: Feb. 7, 1995

[54] WAFER ETCH PROTECTION METHOD

[75] Inventors: Ronald C. Pennell, Chandler; Ira E. Baskett, Tempe; Lynn W. Ford, Scottsdale, all of Ariz.

[73] Assignee: Motorola, Inc., Schaumburg, Ill.

[21] Appl. No.: 987,848

[22] Filed: Dec. 9, 1992

[51] Int. Cl.⁶ ............................................. H01L 21/00
[52] U.S. Cl. .................................. 156/647; 156/662; 156/695.1; 156/649
[58] Field of Search ............... 156/648, 649, 647, 662, 156/659.1

[56] References Cited

U.S. PATENT DOCUMENTS

| | | | |
|---|---|---|---|
| 4,092,209 | 5/1978 | Ipri | 156/628 |
| 4,318,936 | 3/1982 | Moss et al. | 156/662 |
| 4,943,719 | 7/1990 | Akamine | 250/306 |
| 5,141,596 | 8/1992 | Hawkins et al. | 156/628 |

FOREIGN PATENT DOCUMENTS 62-086771 4/1987 Japan .

OTHER PUBLICATIONS

"Study of The Orientation Dependent Etching and Initial Anodization of Si in Aqueous KOH"; J. Electrochem Society; vol. 130; No. 6; 6-83; Faust et al.; pp. 1413-1420.

"Highly Selective KOH-Based Etchant For Boron--Doped Silicon Structures"; Microelectron, Eng.; vol. 9; no. 1 ∝ 4; Bassorus et al.; 5-89'; abstract only.

"Anisotropic Etching of Crystalline Silicon In Alkaline Solutions, II Influence of Dopants"; J. Electrochem. Soc.; vol. 137; No. 11; Nov. 1990 Seidell et al.; abstract only.

Primary Examiner—R. Bruce Breneman
Assistant Examiner—George Goudreau
Attorney, Agent, or Firm—Harry A. Wolin

[57] ABSTRACT

A method of etching a semiconductor wafer includes providing a wafer having a portion thereof to be etched. A highly doped region is formed in the periphery of the wafer which is subsequently etched. The highly doped region of the wafer is substantially etch resistant to an etchant relative to the portion of the wafer being etched.

16 Claims, 1 Drawing Sheet

WAFER ETCH PROTECTION METHOD

FIELD OF THE INVENTION

This invention relates, in general, to the fabrication of semiconductor devices and more particularly to a wafer etch protection method.

BACKGROUND OF THE INVENTION

Silicon pressure sensors have broad applications in a multitude of industries. These sensors typically include a thin, flexible diaphragm and a transducer overlaps the diaphragm. Electronic circuitry is employed in the operation of silicon sensors. In an integrated sensor, this other circuitry is disposed on the same chip as the diaphragm. Non-integrated sensors do not have on-board circuitry.

The fabrication of semiconductor devices in general and silicon pressure sensors in particular requires various types of silicon etches employing different etchants. Wet etches are commonly employed in the fabrication of semiconductor devices and KOH (potassium hydroxide) is a well known wet etchant. KOH is an anisotropic etchant that will etch silicon in the {100} plane at a substantially higher rate than it will etch {111} silicon. Further, KOH will etch silicon dioxide while silicon nitride is etch resistant to KOH.

The diaphragm of a pressure sensor is typically formed by etching a cavity into the backside of a silicon wafer a sufficient depth to create the thin diaphragm. KOH is typically used to etch the cavity and a silicon nitride layer is employed as a mask. It is known to cover the edge of the silicon wafer with the silicon nitride mask layer to protect the wafer edge from being etched and also to protect the wafer from other damage during processing. One particular scheme uses a combination of LPCVD and plasma nitride formed over the wafer edge.

There are significant problems associated with utilizing well known etch protection methods. These problems are typically due to failure to compensate for defects in or on the wafer edge. Edge defects are often caused by high temperature processing such as the formation of epitaxial spikes during epitaxial layer growth. Edge damage such as cracks and chips can also be caused while placing wafers in a wafer boat for nitride layer deposition or the like. This can further create undesired particles along the wafer edge.

Nitride layers typically employed for protection are not perfectly conformal relative to defects on the wafer edge and defects are often thicker than the nitride film employed. Since this nitride does not always completely cover the wafer edges, the edges are somewhat exposed to etchant during steps such as the cavity etch. The etch of these exposed portions of the wafer follows high etch rate secondary planes and may cause significant damage. Undesired etching of the wafer edge, in addition to undesireably etching wafer portions, can cause additional pits, cracks and the like that create stress and significantly damage the die being fabricated on the semiconductor wafer, especially those at the wafer edge. This greatly affects product yield.

Another detrimental effect of the well known utilization of nitrides to protect wafer edges is that silicon nitride is generally a very high stress film. The nitride creates stress on the silicon wafer that causes cracks to develop. Stress is also caused in the wafer by epitaxial and buried layers fabricated therein. This may also cause a silicon nitride coating to crack and expose the wafer to etchant.

In view of the above, it would be highly desirable to have a method to protect the wafer edge during semiconductor processing such as the formation of cavities in pressure sensors.

SUMMARY OF THE INVENTION

A method of etching a semiconductor wafer includes providing a semiconductor wafer having a portion thereof to be etched. A highly doped region is formed in the periphery of the semiconductor wafer followed by the etching of the desired portion of the wafer. The highly doped region of the wafer must be substantially etch resistant to the etchant employed relative to the portion of the semiconductor wafer being etched. The highly doped region of the semiconductor wafer may further be covered with an etch resistant layer.

DETAILED DESCRIPTION OF THE DRAWINGS

Figure 1:
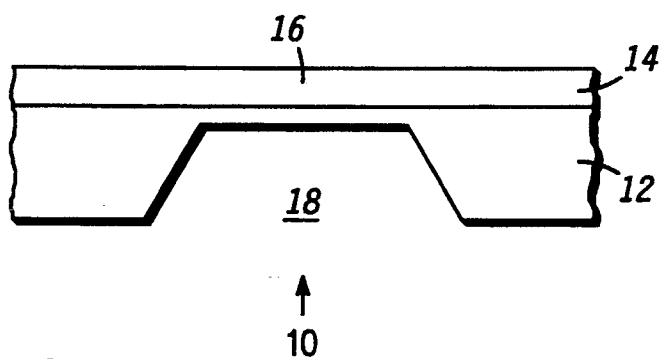
FIG. 1 is a highly enlarged cross-sectional view of a portion of a semiconductor sensor.

FIG. 1 is a highly enlarged cross-sectional view of a portion of a semiconductor sensor 10. Semiconductor sensor 10 includes a substrate 12. Substrate 12 comprises monocrystalline silicon in this embodiment although it should be understood that other materials may be employed. An epitaxial silicon layer 14 is disposed on substrate 12. Epitaxial layer 14 comprises very high grade silicon in which a transducer (not shown) is formed. Operational circuitry (not shown) may also be formed in epitaxial layer 14 if sensor 10 is integrated although such circuitry may also be formed on a separate substrate and later electrically coupled. It should be understood, however, that epitaxial layer 14 is not mandatory and that transducers, circuitry and the like may be fabricated directly in substrate 12. It should further be understood that other forms of wafers may also be utilized such as bonded wafers and the like.

Semiconductor sensor 10 includes a diaphragm 16. Diaphragm 16 comprises a portion of substrate 12 and a portion of epitaxial layer 14 disposed above a cavity 18. Diaphragm 16 flexes in accordance with pressure acting thereon. Diaphragm 16 is fabricated by forming cavity 18 in substrate 12. Although cavity 18 as shown extends only into substrate 12, it should be understood that cavity 18 may also extend into epitaxial layer 14.

Cavity 18 is formed by etching substrate 12. Typically substrate 12 would comprise undoped or lightly doped silicon of a {100} orientation and a KOH solution would be employed as the etchant. In a most preferred embodiment, a 40% KOH solution is employed although one of skill in the art will recognize that KOH solutions of varying concentrations may be utilized. KOH is an anisotropic silicon etchant that will etch {100} oriented silicon substantially faster than it will etch {111} oriented silicon. A KOH etching solution will not etch silicon nitride. Therefore, a silicon nitride etch mask (not shown) will typically be employed to etch cavity 18. It should be understood that if other etchants are employed, other appropriate etch mask materials should be employed.

Figure 2:
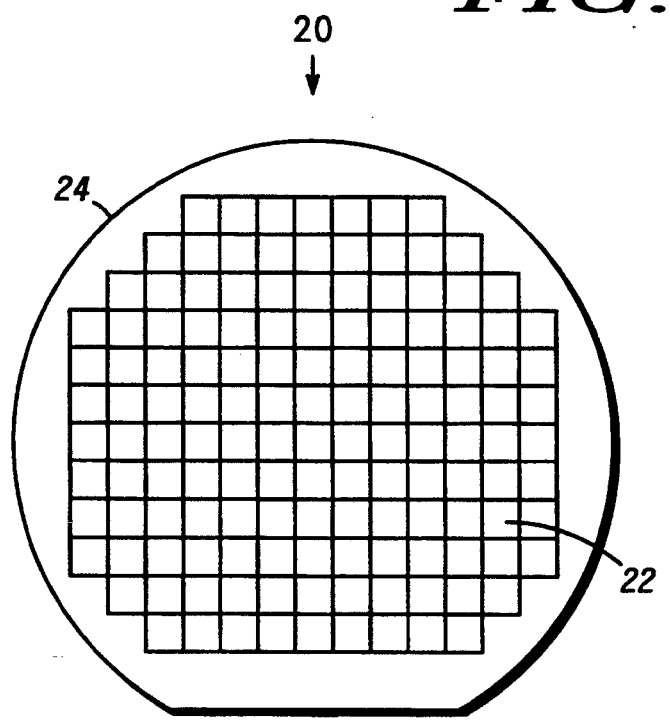
FIG. 2 is a representation of a top view of a semiconductor wafer having a plurality of semiconductor sensors formed therein.

Multiple pressure sensors are typically fabricated simultaneously on a single wafer as depicted by FIG. 2, a representation of a top view of a semiconductor wafer 20 having a plurality of semiconductor sensors 22 formed therein. Sensors 22 are of the same type as semiconductor sensor 10 of FIG. 1. Wafer 20 comprises monocrystalline silicon herein and may or may not have an epitaxial layer formed thereon as previously explained relative to FIG. 1.

During the processing of semiconductor sensors 22 in semiconductor wafer 20, there tends to be damage to, defects in or particles on wafer 20 at edges 24. These imperfections at edges 24 render it increasingly difficult to protect edges 24 during the etching of cavities such as cavity 18 of FIG. 1. Edges 24 are typically protected by coating them with nitride. The same nitride layer employed as the etch mask for cavities 18 may be utilized to protect the edges. The imperfections at edges 24 result in cracks, gaps and the like in the nitride masking layer. Cracks, gaps and the like allow etchant to attack edges 24 during the etching of cavities. This causes damage to the wafers and especially to sensors 22 disposed near edges 24. This is explained in detail in the Background of the Invention of this application.

Edges 24 may be protected from etchants by dopant. A KOH etchant will not etch P type silicon having a dopant concentration of at least $1 \times 10^{19}$ atoms/cm$^3$. Therefore, by doping edges 24 of wafer 20 with a P type dopant such as boron to a desired doping concentration, they will not be etched when exposed to KOH solutions. Edges 24 of wafer 20 may be doped by methods well known in the art. These methods include implantation, diffusion and solid source although spin-on source doping is preferred.

This edge protection works especially well when doped edges 24 are coated by a silicon nitride coating. The nitride layer provides significant protection and no etching of doped edges 24 of wafer 20 will occur through undesireable cracks and the like in a nitride masking layer. It should be understood that in some cases, however, it may not be necessary to protect doped edges 24 with a nitride layer. It should further be understood that although a specific embodiment wherein a silicon wafer 20 having heavily doped edges 24 that will not be etched by KOH is disclosed, the present invention may also be employed utilizing different wafers, dopants and etchants.

As is set forth in the Background of the Invention, commonly used nitride coatings cause significant stress that acts upon wafer 20 and contributes to edge 24 damage. Accordingly, a low stress silicon nitride coating is desireable. A low stress silicon nitride coating may be formed by a plasma deposition process. A Concept One plasma reactor manufactured by Novellus may be employed for such a purpose. The Concept One reactor creates a plasma by the simultaneous use of two frequencies.

Thus it is apparent that there has been provided, in accordance with the invention, an improved method of protecting the edges of a wafer that may be utilized during the fabrication of semiconductor devices such as pressure sensors. While specific embodiments of the invention have been shown and described, further modifications and improvements will occur to those of skill in the art. It is desired that it be understood, therefore, that this invention is not limited to the particular forms shown and it is intended in the appended claims to cover all modifications which do not depart from the spirit and scope of this invention.

What is claimed is:

1. A method of etching a semiconductor wafer comprising the steps of:
   providing a semiconductor wafer having a portion thereof to be etched;
   forming a highly doped region along edges of said semiconductor wafer;
   etching said portion of said semiconductor wafer to be etched with an etchant; and
   wherein said highly doped region of said semiconductor wafer is etch resistant to said etchant relative to said portion of said semiconductor wafer being etched.

2. The method of claim 1 wherein a layer resistant to said etchant is formed on at least a portion of the highly doped region of the semiconductor wafer.

3. The method of claim 2 wherein the providing step includes providing a silicon wafer, the forming step includes forming a P+ region, the etching step includes etching with a KOH solution and forming a layer resistant to said etchant includes forming a silicon nitride layer.

4. The method of claim 3 wherein the forming a P+ region step includes forming a P+ region having a dopant concentration of at least $1 \times 10^{19}$ atoms/cm$^3$.

5. The method of claim 4 wherein the forming a silicon nitride layer step includes forming a plasma silicon nitride layer.

6. The method of claim 5 wherein the etching step includes etching a cavity in a silicon pressure sensor.

7. A method of protecting the edge of a silicon wafer during etching comprising the steps of:
   providing a silicon wafer having a portion thereof to be etched;
   doping the edge of said silicon wafer to have a P+ conductivity type and a doping concentration of at least $1 \times 10^{19}$ atoms/cm$^3$;
   forming a silicon nitride layer on said doped edge of said silicon wafer; and
   etching said portion to be etched of said silicon wafer with a KOH solution.

8. The method of claim 7 wherein the providing step includes providing a silicon wafer having a layer of epitaxial silicon thereon.

9. The method of claim 7 wherein the doping step includes doping by implant, diffusion, spin-on source or solid source.

10. The method of claim 7 wherein the forming a silicon nitride layer step includes forming a plasma silicon nitride layer.

11. The method of claim 10 wherein the forming a silicon nitride layer includes forming a silicon nitride layer that serves as a mask for the etching step.

12. The method of claim 7 wherein the etching step includes etching a cavity in a silicon pressure sensor.

13. A method of fabricating silicon pressure sensors in a silicon wafer comprising the steps of:
   providing a silicon wafer to have pressure sensors fabricated therein;
   doping the edge of said silicon wafer with a P-type dopant to a concentration of at least $1 \times 10^{19}$ atoms/cm$^3$;
   forming a silicon nitride layer on said doped edge and on other portions of said silicon wafer to serve as a cavity etch mask; and etching cavities in said silicon wafer with a KOH solution, said cavities to establish a diaphragm in said pressure sensors.

14. The method of claim 13 wherein the providing step includes providing a silicon wafer having an epitaxial layer thereon.

15. The method of claim 14 wherein the etching step includes etching cavities into the epitaxial layer.

16. The method of claim 13 wherein the forming step includes forming a plasma silicon nitride layer.

* * * * *